(12) United States Patent
Lillie et al.

(10) Patent No.: US 6,841,084 B2
(45) Date of Patent: Jan. 11, 2005

(54) ETCHING SOLUTION FOR FORMING AN EMBEDDED RESISTOR

(75) Inventors: Dan Lillie, Garfield Heights, OH (US); Jiangtao Wang, Cleveland Heights, OH (US)

(73) Assignee: Nikko Materials USA, Inc., Chandler, AZ (US)

(*) Notice: Subject to any disclaimer, the term of this patent is extended or adjusted under 35 U.S.C. 154(b) by 319 days.

(21) Appl. No.: 10/073,503

(22) Filed: Feb. 11, 2002

(65) Prior Publication Data

US 2003/0150840 A1 Aug. 14, 2003

(51) Int. Cl.⁷ .............................. B44C 1/22; C03C 15/00; C03C 25/68; C23F 1/00; C23F 3/00
(52) U.S. Cl. .................................................. 216/100
(58) Field of Search .............................. 216/13, 16, 83, 216/95, 96, 100, 105, 106; 438/745, 754, 749, 750, 751

(56) References Cited

U.S. PATENT DOCUMENTS

| | | | |
|---|---|---|---|
| 2,230,156 A | 1/1941 | Carman | 41/42 |
| 2,687,345 A | 8/1954 | Murry | 41/42 |
| 3,102,808 A | 9/1963 | Weisberg et al. | 75/97 |
| 3,607,450 A | 9/1971 | Kiewit | 148/1.5 |
| 3,644,155 A | 2/1972 | Hogya et al. | 156/20 |
| 3,668,131 A | 6/1972 | Banush et al. | 252/79.4 |
| 4,160,691 A | 7/1979 | Abolafia et al. | 156/664 |
| 4,311,551 A | 1/1982 | Sykes | 156/640 |
| 4,370,197 A | 1/1983 | Abolafia et al. | 156/659 |
| 4,588,471 A | 5/1986 | Griffith et al. | 156/652 |
| 4,715,894 A | 12/1987 | Holtzman et al. | 106/1.22 |
| 4,784,785 A | 11/1988 | Cordani et al. | 252/79.4 |
| 4,826,565 A | 5/1989 | Susuki et al. | 156/668 |
| 5,017,271 A | 5/1991 | Whewell et al. | 204/15 |
| 5,428,263 A | 6/1995 | Nagano | 313/585 |
| 6,117,250 A | 9/2000 | Schemenaur et al. | 148/248 |
| 6,150,279 A | 11/2000 | Ku | 438/707 |

*Primary Examiner*—Gregory Mills
*Assistant Examiner*—Roberts Culbert
(74) *Attorney, Agent, or Firm*—Kusner & Jaffe

(57) ABSTRACT

A resistive etching solution containing thiourea, which is particularly suitable for etching an electrically resistive material comprised of a nickel-chromium alloy. The resistive etching solution allows for fast and effective etching of a nickel-chromium alloy in cases where the ratio of (a) copper surface area to (b) nickel/chromium surface area, is relatively large, and where fine feature etching is desired.

15 Claims, 1 Drawing Sheet

US 6,841,084 B2

ETCHING SOLUTION FOR FORMING AN EMBEDDED RESISTOR

FIELD OF THE INVENTION

The present invention relates to an etching solution for etching an electrically resistive layer on a resistive foil, and more specifically to an etching solution containing thiourea, which is particularly suitable for etching an electrically resistive layer comprised of a nickel-chromium alloy.

BACKGROUND OF THE INVENTION

As electronic devices become smaller and lighter, associated printed circuit boards (PCBs) need to be smaller and thinner. To reduce the size of PCBs, trace lines are made finer, and spaces for electrical interconnections on the PCB are reduced. Integration of passive discrete components (such as embedded resistors) into the PCB is also useful in reducing the size of PCBs. Integrating the functionality of passive discrete components into a PCB's laminate substrate, frees up PCB surface area available for discrete components. Consequently, the use of embedded passive components allows for increased device functionality by incorporation of a greater, number of active components without using more PCB surface area. Furthermore, embedding passive components into a PCB not only allows for further miniaturization of electronic devices, but also improves reliability and electrical performance.

One prior art approach to making embedded resistors has been to use resistive foils that are made by depositing a thin film of an electrically resistive material on a copper foil. Metal alloys having nickel (Ni) and chromium (Cr) as major constituents (hereinafter referred to as "nickel-chromium" or "Ni/Cr" alloys) are typically used as the electrically resistive material in forming embedded resistors. One such metal alloy is Ni/Cr/Si/Al. The process for forming an embedded resistor includes: (a) laminating the resistive foil on a dielectric layer, (b) sequentially etching the resistive foil to form resistors, and (c) burying the formed resistors within a multi-layer printed circuit board.

In the above-mentioned sequential etching process, a first selective etching solution is used to remove unwanted copper without attacking the Ni/Cr alloy. A second selective etching solution is then used to remove the unwanted Ni/Cr alloy without attacking the copper. Acidic chromium etching solutions are preferred in etching Ni/Cr alloys.

There are several patents for acidic chromium etching solutions. For example, U.S. Pat. No. 2,230,156 describes a chromium etching solution containing hydrochloric acid and glycol, the glycol having more carbon atoms than hydroxyl groups, and U.S. Pat. No. 2,687,345 describes a chromium etching solution containing calcium chloride and ethylene glycol. Furthermore, U.S. Pat. No. 4,160,691 describes a chromium etching solution containing hydrochloric acid and glycerin. All of these noted solutions are acidic chromium etching solutions, which effectively remove chromium with little or no attack of the copper. Therefore, these prior art etchants may be used to etch a Ni/Cr alloy layer.

It has been observed that the etching rate of solutions of the type heretofore described decreases significantly as the following ratio increases:

$$\frac{\text{the surface area of copper exposed to the etching solution } (C_{SA})}{\text{the surface area of Ni/Cr alloy exposed to the etching solution } (R_{SA})}$$

This ratio (hereinafter referred to as "the $C_{SA}/R_{SA}$ ratio") can reach a value wherein etching of the Ni/Cr alloy is inhibited. Moreover, it has been found that some Ni/Cr alloy etching solutions may dissolve treatments (including, but not limited to, adhesion-promoting treatments (e.g., nodular treatments), thermal barrier layer treatments, stain proofing treatments, and resin resistant coating treatments) that are deposited on the copper surface to enhance the peel strength and shelf life of a resistive foil.

The present invention addresses these and other drawbacks of the prior art and provides an etching solution containing thiourea, for etching a resistive layer comprised of a nickel-chromium alloy.

SUMMARY OF THE INVENTION

In accordance with the present invention, there is provided a resistive etching solution for etching an electrically resistive material including a nickel-chromium alloy, comprising hydrochloric acid and thiourea.

In accordance with another aspect of the present invention, there is provided a process for forming an embedded resistor from a resistive foil having a copper layer and a resistive layer, wherein the resistive foil is bonded to a dielectric layer, the method comprising: selectively removing portions of the copper layer with a copper etchant to form trace lines; and selectively etching the resistive layer with an etchant comprised of hydrochloric acid and thiourea.

It is an object of the present invention to provide an etchant for etching a Ni/Cr alloy.

It is still another object of the present invention to provide an etchant which improves the etching rate of a Ni/Cr alloy.

It is yet another object of the present invention to provide an etchant as described above which suitably etches Ni/Cr alloy where the $C_{SA}/R_{SA}$ ratio is relatively large.

These and other objects will become apparent from the following description of a preferred embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF PREFERRED EMBODIMENT

Figure 1:
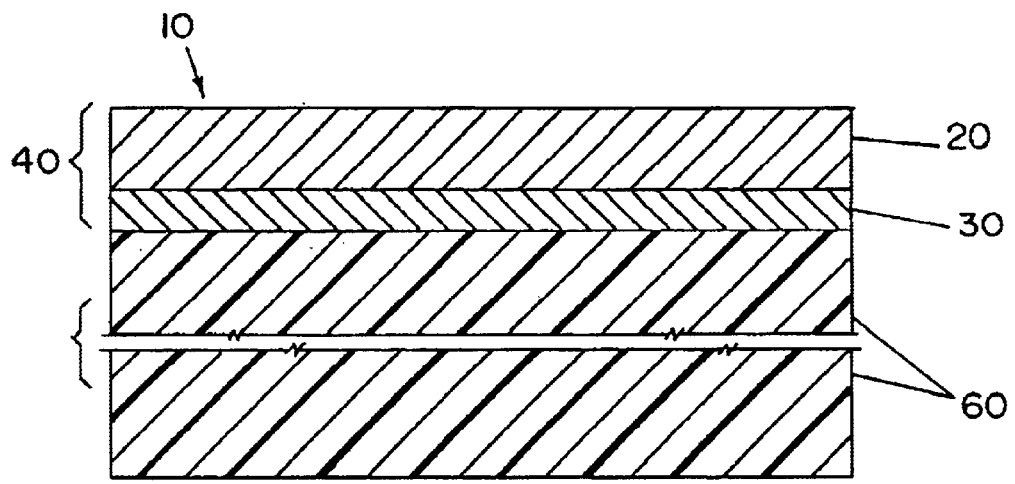
FIG. 1 is a cross-sectional view of a laminate assembly comprising a resistive foil bonded to a dielectric layer.

Referring now to the drawings wherein the showings are for the purpose of illustrating the preferred embodiment of the invention only, and not for the purpose of limiting same, FIG. 1 shows a cross-sectional view of a laminate 10 generally comprised of a resistive foil 40 bonded to a dielectric layer 60. Resistive foil 40 includes a copper layer 20 and a resistive layer 30. Resistive foil 40 is formed by depositing resistive layer 30 on copper layer 20. By way of example and not limitation, resistive layer 30 is deposited using a sputtering process. Resistive layer 30 may take many suitable forms, including but not limited to, a nickel-chromium alloy, and preferably a nickel-chromium alloy comprised of nickel, chromium, aluminum and silicon (Ni/Cr/AU/Si). In a preferred embodiment, the Ni/Cr/Al/Si alloy is comprised of 56 wt % nickel/38 wt % chromium/4 wt % aluminum/2 wt % silicon. Dielectric layer 60 is, by way of example and not limitation, a cured epoxy resin containing woven glass fiber (conventionally referred to as a "prepreg").

A sequential etching process is used to form resistors. The sequential etching process includes a first selective etching process for etching copper layer 20 and a second selective etching process for etching resistive layer 30.

Figure 2:
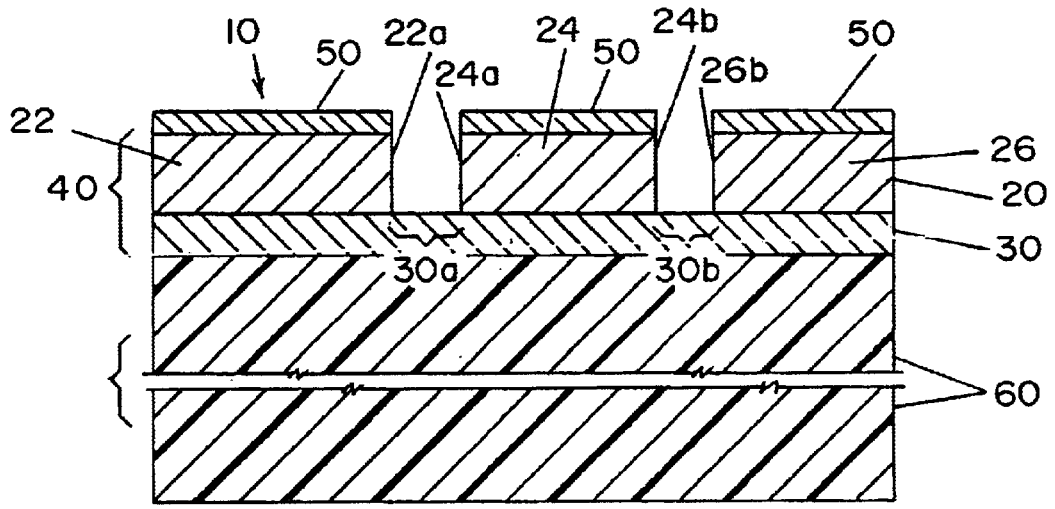
FIG. 2 is a cross-sectional view of the laminate assembly shown in FIG. 1, after an etching process to etch away portions of the copper layer of the resistive foil.

As is conventional in the prior art, in preparation for etching copper, a photoresist layer 50 is applied to copper layer 20, a mask (not shown) is applied over photoresist layer 50, and selected portions of photoresist layer 50 are cured in accordance with the mask. The mask is then removed, followed by removal of uncured photoresist. Cured photoresist remains on copper layer 20 where trace lines are to be formed by etching. FIG. 2 illustrates laminate 10 following the first selective etching process wherein trace lines are formed. In this regard, selective portions of copper layer 20 are removed to form trace lines 22, 24 and 26.

Figure 3:
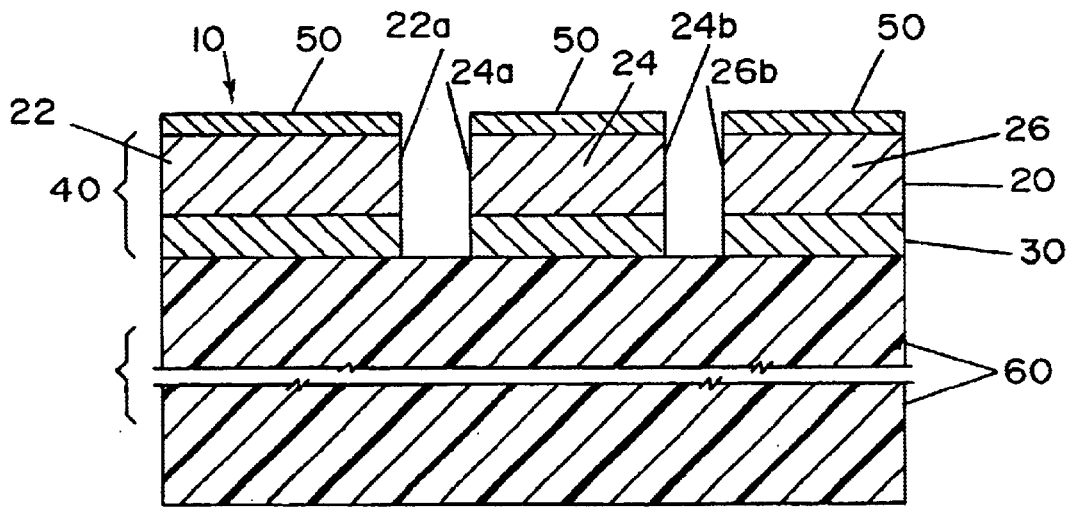
FIG. 3 is a cross-sectional view of the laminate assembly shown in FIG. 2, after an etching process to etch away portions of the resistive layer of the resistive foil.

FIG. 3 illustrates laminate 10 following the second etching process wherein selected portions of resistive layer 30 are removed. It will be understood by those skilled in the art that any areas of exposed resistive layer 30 that are not to be etched by the second selective etching process must be covered with an appropriate photoresist.

As discussed above, it has been observed that the presence of copper, and more specifically the amount of exposed copper surface area to be etched, appears to affect the performance of etching solutions used to remove the resistive material. In one respect, the etching rate of an electrically resistive material (typically a Ni/Cr alloy) will decrease significantly as there is an increase in the $C_{SA}/R_{SA}$ ratio. This ratio has been observed to reach a value wherein resistive layer etching is completely inhibited. By way of example, in the embodiment shown in FIG. 2, the exposed copper sidewalls 22a and 24a have a surface area significantly greater than the surface area of the exposed resistive material 30a. Likewise, it can be observed that the surface area of exposed copper sidewalls 24b and 26b have a significantly greater surface area than the surface area of exposed resistive material 30b.

It has also been observed that the etching rate of the resistive material using etching solutions will also decrease as the exposed copper is in closer proximity to the resistive material to be etched. Thus, in the example shown in FIG. 2, as spacing between trace lines 22, 24 and 26 decreases, the size of exposed areas 30a, 30b relative to exposed copper sidewalls 22a, 24a, 24b and 26b and the proximity of exposed areas 30a, 30b to sidewalls 22a, 24a, 24b, 26b decreases. As a result, the etching rate of conventional etching solutions will be observed to decrease. Moreover, it has been found that conventional resistive etching solutions may dissolve treatments deposited on copper layer 20.

As will be appreciated, the $C_{SA}/R_{SA}$ ratio can be reduced by not stripping the cured photoresist from copper layer 20 after unwanted copper has been removed by the copper etchant. Accordingly, photoresist covers copper layer 20 while unwanted portions of resistive layer 30 (e.g., Ni/Cr alloy) are etched by a Ni/Cr etching solution. The cured photoresist on copper layer 20 reduces the exposed copper surface area.

In the case of high density interconnect PCBs, where finer lines and spaces for electrical interconnections are needed on the PCB, the dimensions of lines and the spaces therebetween become smaller. However, it has been observed that when spaces less than about 2–6 mil wide are to be etched, appropriate etching of the resistive material is difficult using conventional resistive etching solutions, due to the large amount of copper relative to resistive material.

In accordance with a preferred embodiment of the present invention, a resistive etching solution is provided which results in increased etching rates in the case of high $C_{SA}/R_{SA}$ ratios, as well as in cases where the etching spaces are small, i.e., less than about 2–6 mil wide. The preferred etching solution is particularly suitable for etching resistive material comprised of a nickel-chromium alloy, such as, by way of example and not limitation, a Ni/Cr/Al/Si alloy.

In accordance with a preferred embodiment of the present invention, an etching solution comprised of HCl and thiourea is provided. In a preferred embodiment, the resistive etching solution is a solution comprised of HCl, glycerin and thiourea. The thiourea is observed to significantly increase the etching rate of nickel-chromium alloy, especially in the case where there is a high $C_{SA}/R_{SA}$ ratio. The addition of thiourea to the resistive etching solution also makes it possible to carry out suitable fine feature etching (i.e., etching nickel-chromium alloy resistive material in exposed areas 30a, 30b of <6 mil), even without the presence of photoresist on the copper during the resistive etching process.

A preferred resistive etching solution includes hydrochloric acid (37% by weight HCl) in the range of 5 volume % to 95 volume % (preferably about 43 volume %), glycerin in the range of 5 volume % to 95 volume % (preferably about 46 volume %), thiourea in the range of 0.1 ppm to 100 grams/liter (more preferably 1 ppm to 2 ppm), and sufficient water to makeup 100% (volume % total). The temperature of the preferred resistive etching solution is in the range of room temperature (about 68° F. to about 77° F.) to about boiling point temperature of the etching solution (about 220° F.), preferably in the range of 120° F. to 180° F., and more preferably in the range of 140° F. to 150° F. The resistive etching solution is preferably applied by spraying.

The present invention will now be further described by way of the following Examples wherein two like etching solutions, one with thiourea and one without thiourea, are used to etch a like resistive material. Referring now to Examples 1 and 2, a comparison of etching times with and without thiourea is shown.

EXAMPLE 1

Etching solution: HCl (43 volume %), glycerin (46 volume %), thiourea (2 ppm), water (11 volume %)
Etching solution temperature: 150° F.
Copper foil (weight per unit area): 1 oz./ft$^2$ Resistive Material: Ni (56 wt %)/Cr (38 wt %)/Al (4 wt %)/Si (2 wt %)

Thickness of resistive material: 0.1 μm spacing between adjacent trace lines: 2–4 mils

| | Etching Times | |
|---|---|---|
| | Without thiourea | With 2 ppm thiourea |
| With photoresist | 6 min. | 3 min. |
| Without photoresist | No etching | 5 min. |

EXAMPLE 2

Etching solution: HCl (43 volume %), glycerin (46 volume %), thiourea (2 ppm), water (11 volume %)

Etching solution temperature: 150° F.

Copper foil (weight per unit area): 1 oz./ft$^2$

Resistive Material: Ni (56 wt %)/Cr (38 wt %)/Al (4 wt %)/Si (2 wt %)

Thickness of resistive material: 0.03 μm spacing between adjacent trace lines: 2–4 mils

| | Etching Times | |
|---|---|---|
| | Without thiourea | With 2 ppm thiourea |
| With photoresist | 4 min. | 2 min. |
| Without photoresist | No etching | 3 min. |

As can be observed from the illustrated etching times for Examples 1 and 2, resistive etching solutions including thiourea have significantly higher etching rates when the photoresist remains present during the resistive etching process. In this respect, the etching time is reduced by approximately 50%. In the case where the photoresist has been removed, the resistive etching solution with thiourea facilitates resistive etching that was not possible with a resistive etching solution that excluded thiourea.

Other modifications and alterations will occur to others upon their reading and understanding of the specification. It is intended that all such modifications and alterations be included insofar as they come within the scope of the invention as claimed or the equivalents thereof.

Having described the invention, the following is claimed:

1. A process for forming an embedded resistor from a resistive foil having a copper layer and a resistive layer including a nickel-chromium alloy having at least one of aluminum and silicon, wherein the resistive foil is bonded to a dielectric layer, the method comprising:

selectively removing portions of the copper layer with a copper etchant to form trace lines; and selectively etching the resistive layer including the nickel-chromium alloy with an etchant comprised of hydrochloric acid, glycerin and thiourea, wherein said glycerin is in a range of 5 volume % to 95 volume %, and said thiourea is in a range of about 1 ppm to 200 ppm.

2. A process according to claim 1, wherein a photoresist is applied to the copper layer to define the trace lines.

3. A process according to claim 2, wherein said photoresist is not removed prior to the selective etching of the resistive layer.

4. A process according to claim 2, wherein said photoresist is removed prior to the selective etching of the resistive layer.

5. A process according to claim 1, wherein said hydrochloric acid is about 43 volume %.

6. A process according to claim 1, wherein said thiourea is in a range of 1 ppm to 20 ppm.

7. A process according to claim 1, wherein said glycerin is about 46 volume %.

8. A process according to claim 1, wherein said solution further comprises water.

9. A process according to claim 8, wherein said water is in a quantity sufficient to makeup 100% of volume % total.

10. A process according to claim 1, wherein said solution is at a temperature in a range of room temperature to about boiling point temperature of said solution.

11. A process according to claim 10, wherein said solution is at a temperature in a range of 120° F. to 180° F.

12. A process according to claim 11, wherein said solution is at a temperature in a range of 140° F. to 150° F.

13. A process according to claim 1, wherein said nickel-chromium alloy includes aluminum and silicon.

14. A process according to claim 13, wherein said nickel-chromium alloy is comprised of 56 wt % nickel, 38 wt % chromium, 4 wt % aluminum, and 2 wt % silicon.

15. A process according to claim 1, wherein said thiourea is in a range of about 1 ppm to 2 ppm.

* * * * *